(12) United States Patent
Hsu et al.

(10) Patent No.: US 7,663,204 B2
(45) Date of Patent: Feb. 16, 2010

(54) SUBSTRATE FOR MULTI-CHIP STACKING, MULTI-CHIP STACK PACKAGE UTILIZING THE SUBSTRATE AND ITS APPLICATIONS

(75) Inventors: Hung-Hsin Hsu, Hsinchu (TW); Chih-Wei Wu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 361 days.

(21) Appl. No.: 11/790,826

(22) Filed: Apr. 27, 2007

(65) Prior Publication Data

US 2008/0265389 A1    Oct. 30, 2008

(51) Int. Cl.
*H01L 29/00* (2006.01)
*H01L 23/48* (2006.01)

(52) U.S. Cl. .................... 257/529; 257/784; 257/777; 257/786; 257/E23.149

(58) Field of Classification Search ................. 257/529, 257/784, 701, 777, 723, E23.149
See application file for complete search history.

(56) References Cited

U.S. PATENT DOCUMENTS

| | | | | | |
|---|---|---|---|---|---|
| 5,049,969 A | * | 9/1991 | Orbach et al. | ................ | 257/211 |
| 5,541,814 A | * | 7/1996 | Janai et al. | ................ | 361/778 |
| 5,661,330 A | * | 8/1997 | Aimi et al. | ................ | 257/529 |
| 5,682,057 A | * | 10/1997 | Kuriyama | ................ | 257/529 |
| 5,882,998 A | * | 3/1999 | Sur et al. | ................ | 438/601 |
| 6,285,067 B1 | * | 9/2001 | Hyoudo et al. | ................ | 257/529 |
| 6,351,040 B1 | * | 2/2002 | Schoenfeld | ................ | 257/784 |
| 6,424,035 B1 | * | 7/2002 | Sapp et al. | ................ | 257/723 |
| 6,946,747 B1 | * | 9/2005 | Mori et al. | ................ | 257/786 |
| 7,091,564 B2 | * | 8/2006 | Hasegawa | ................ | 257/372 |
| 2002/0140107 A1 | * | 10/2002 | Kato et al. | ................ | 257/777 |
| 2003/0151135 A1 | * | 8/2003 | Sakamoto et al. | ................ | 257/723 |

* cited by examiner

*Primary Examiner*—Nitin Parekh

(57) ABSTRACT

A substrate for multi-chip stacking and a multi-chip stack package utilizing the substrate and its applications are disclosed. The substrate comprises a first wire-bonding finger, a second wire-bonding finger, a trace configured for electrical transmission and a loop wiring on a same surface. The first wire-bonding finger and the second wire-bonding finger are adjacent each other and to a die-attaching area of the substrate. The loop wiring connects the first wire-bonding finger with the second wire-bonding finger in series and connected to the trace. The loop wiring can be selectively broken or not when at least two chips are stacked on the die-attaching area and electrically connected to the first and second wire-bonding fingers respectively. Accordingly, the chips can operate respectively and independently without mutual interference if one of the chips is fail. Moreover, there is merit to apply the multi-chip stack package utilizing the substrate because it can be repaired after molding and without removing any bonding wire during semiconductor packaging processes.

18 Claims, 8 Drawing Sheets

| test result \ fuse | F1 | F2 | F3 |
|---|---|---|---|
| both good | on | on | on |
| first chip fail | off | off | on |
| second chip fail | on | off | off |

US 7,663,204 B2

SUBSTRATE FOR MULTI-CHIP STACKING, MULTI-CHIP STACK PACKAGE UTILIZING THE SUBSTRATE AND ITS APPLICATIONS

FIELD OF THE INVENTION

The present invention relates to multi-chip stacking technologies, more particularly, to a substrate for multi-chip stacking, multi-chip stack package utilizing the substrate and its applications.

BACKGROUND OF THE INVENTION

Due to the extremely advanced nature of today's electric technique, the electronics industry provides various products with more complicated and more humanistic functionality. The recent trends of electric products are towards light, thin and compact. Numerous improvements within electric technique have been made in recent years to meet the requirements for microminiaturization and speedy operation, so that a plurality of chips are vertically stacked on a substrate to obtain a great capacity with several times or a requirement with more functions as well as sealed in a package, which may be called multi-chip stack package. Nevertheless, the plural chips are sealed with an encapsulant while performing multi-chip stack packaging process formerly and then various electrical tests are performed after encapsulated. If a chip only among the multi-chip stack package cannot operate normally, it results in that the entire semiconductor package couldn't work normally and is unable to be fixed after encapsulated.

Referring to FIG. 1, a conventional multi-chip stack package primarily comprises a substrate 100, a first chip 10, a second chip 20, a plurality of bonding wires 31 and 32 and an encapsulant 40. According to FIG. 2, the substrate 100 includes a plurality of wire-bonding fingers 110 and a plurality of traces 120 formed on an inner surface 101 of the substrate 100, where the wire-bonding fingers 110 are adjacent to a die-attaching area 103 of the substrate 100. The first chip 10 is attached onto the die-attaching area 103 and the second chip 20 is stacked above the first chip 10. Referring again to FIGS. 1 and 2, the wire-bonding fingers 110 formed on the inner surface 101 are exposed on an insulation layer 130 of the substrate 100 for wire-bonding connection. A plurality of external contact pads 140 are formed on an outer surface 102 of the substrate 100. The first chip 10 has a plurality of first bonding pads 11, which are electrically connected with the corresponding wire-bonding fingers 110 via the first bonding wires 31. An interposer 12 is disposed between the first chip 10 and the second chip 20. The second chip 20 has a plurality of second bonding pads 21, which are electrically connected with the wire-bonding fingers 110 via the second bonding wires 32. Accordingly, the wire-bonding fingers 110 utilizing an identical signal or common power/ground may be connected with a first bonding wire 31 and a second bonding wire 32 simultaneously (as shown in FIG. 2).

The known multi-chip stack package mentioned above may further comprise an encapsulant 40 to seal the first chip 10 and the second chip 20 to be applicable for memory cards or BGA packages. Sometimes, there has had faults in chips or connecting bonding wires thereof during semiconductor packaging processes, but the encapsulated chips are not rework-able when they had been tested to find out which one or portion of them cannot operate normally after packaged. The entire multi-chip stack package is unable to work normally if only one or portion of chips and/or bonding wires has trouble and has been sealed and electrically connected with substrate to involve other good chips in failure, must be discarded resulting in high scrapped rate.

There are several methods to solve the problem mentioned above at present and one of them is to perform completed electrical function tests for all chips in wafer level to identify KGD (Known Good Die) or not, but the cost for this test is too expensive to apply for mass production in low cost. Another method is to provide a fix step during semiconductor packaging processes, which is disclosed in R.O.C. Taiwan Patent publication No. 409,330 titled "repairable multi-chip module package". A test is performed during die-attaching process and electrically connecting process after finishing lower-layer chip assembly but prior to encapsulation process to identify the lower-layer chips are bad or not. When chip qualities are confirmed, and then a repairing step is executed. The bonding wires connecting with bad chip(s) are removed and then a substitute chip (KGD) is attached above the bad chip. However, since this repairing method needs to provide an on-line test and removal of the bonding wires connecting with bad chips on lower layer prior to encapsulation process, the quality after encapsulation process is still uncertain and there are extra limitations in the fabricating processes. Besides, the stack method that the good chip are stacked above the bad chips is not reserved for the use of multi-chip stack package.

SUMMARY OF THE INVENTION

The primary object of this invention is to provide a substrate for multi-chip stacking and a multi-chip stack package utilizing the substrate and its applications, which allows a plurality of chips to be stacked in a package and operate respectively and independently without mutual interference to repair after test by applying loop wiring connected with fuses.

The secondary object of this invention is to provide a substrate for multi-chip stacking and a multi-chip stack package utilizing the substrate and its applications, which enables to perform a repairing step by fuse-breaking after encapsulation process to obtain an efficiency of fix without removing bonding wires.

One aspect of this invention provides a substrate for multi-chip stacking that at least comprises a first wire-bonding finger, a second wire-bonding finger, a trace and a loop wiring. The first wire-bonding finger is adjacent to a die-attaching area and the second wire-bonding area is adjacent to the die-attaching area and to the first wire-bonding finger. The trace is configured for electrical transmission and the loop wiring connects in series with the first wire-bonding finger and the second wire-bonding finger and is connected to the trace. Moreover, this invention further discloses a multi-chip stack package utilizing the substrate and its applications.

From FIG. 7A to FIG. 7D illustrate fuse-breaking method on the bottom of the substrate after wire-bonding and encapsulation processes in accordance with the first embodiment of this invention.

Figure 8:
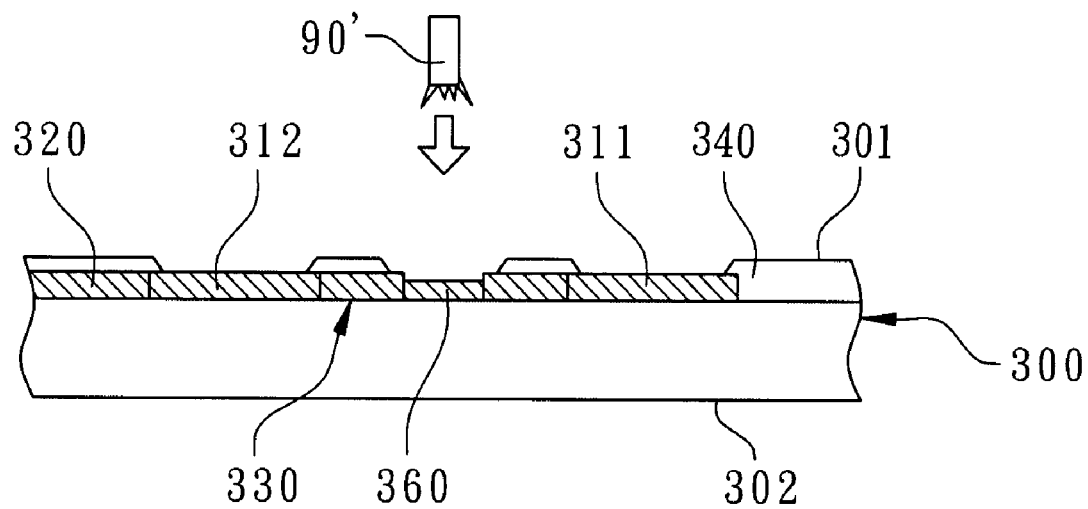

FIG. 8 shows a cross-sectional view of a portion of another substrate in accordance with the second embodiment of this invention.

Figure 9A:
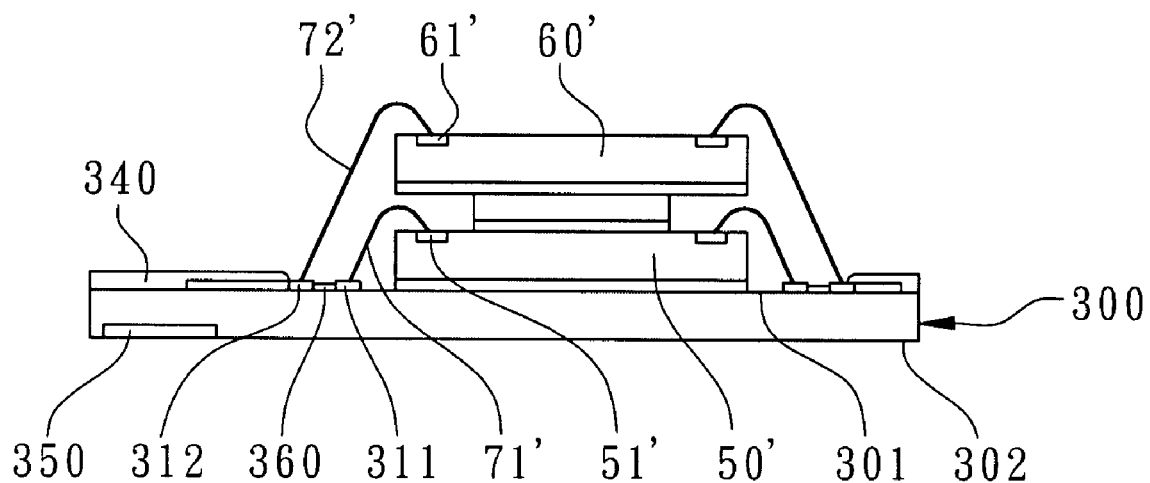
Figure 9B:
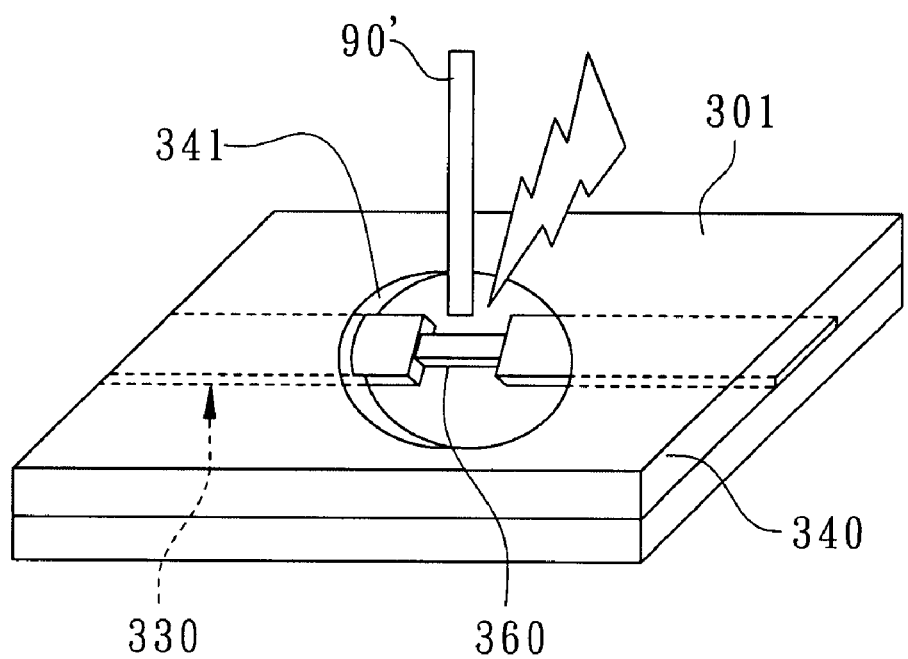
Figure 9C:
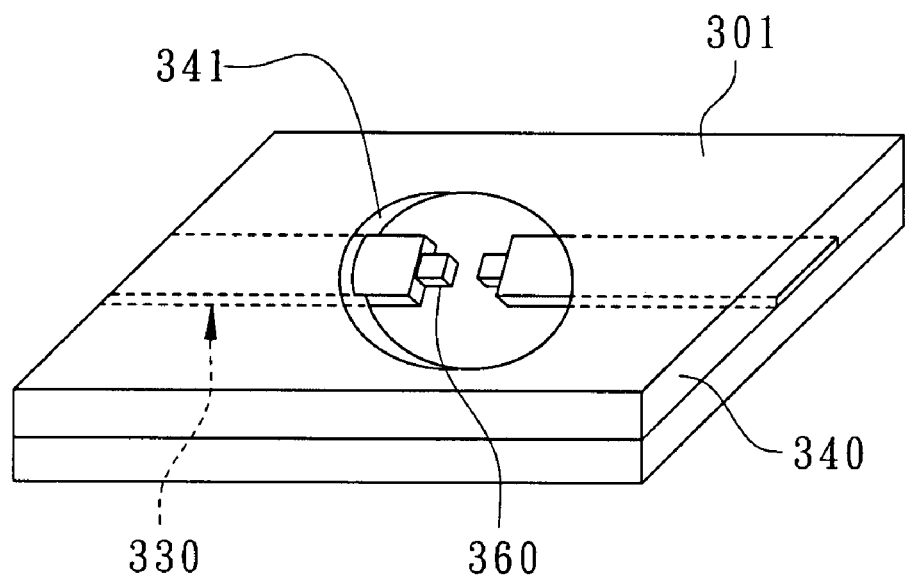

From FIG. 9A to FIG. 9C illustrate fuse-breaking method on the top of the substrate after wire-bonding process but prior to encapsulation process in accordance with the second embodiment of this invention.

Figure 10:
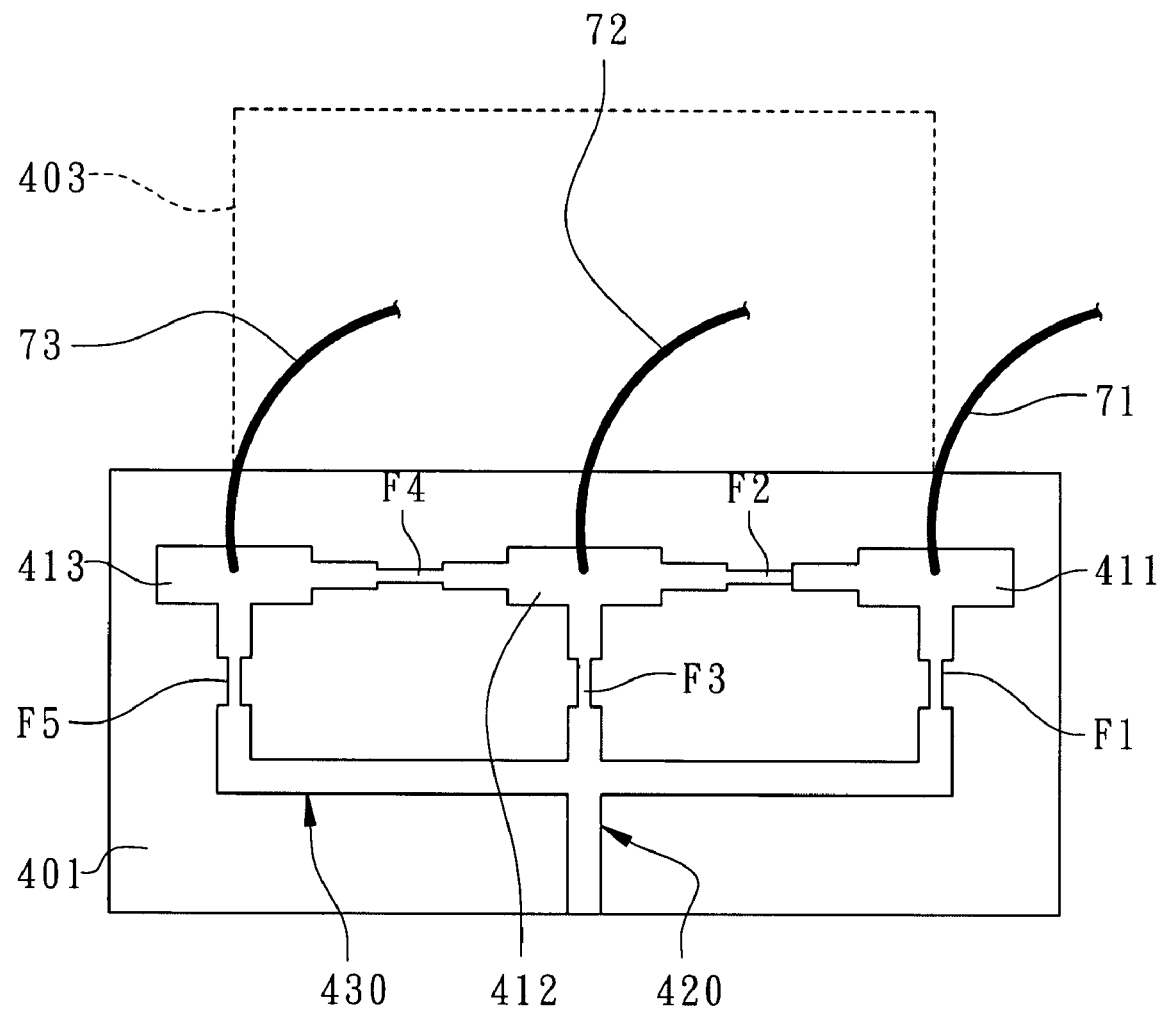

FIG. 10 shows a portion of an inner surface of another substrate after wire-bonding process in accordance with the third embodiment of this invention.

DETAILED DESCRIPTION OF THE INVENTION

Figure 1:
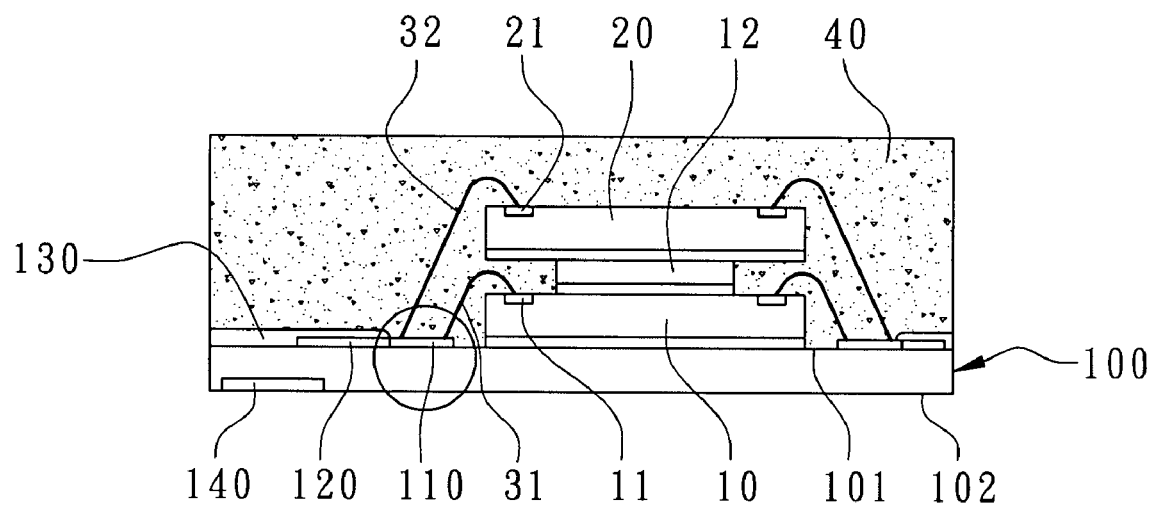
FIG. 1 is a cross-sectional view of a known substrate for multi-chip stacking applied for a multi-chip stack package.
Figure 2:
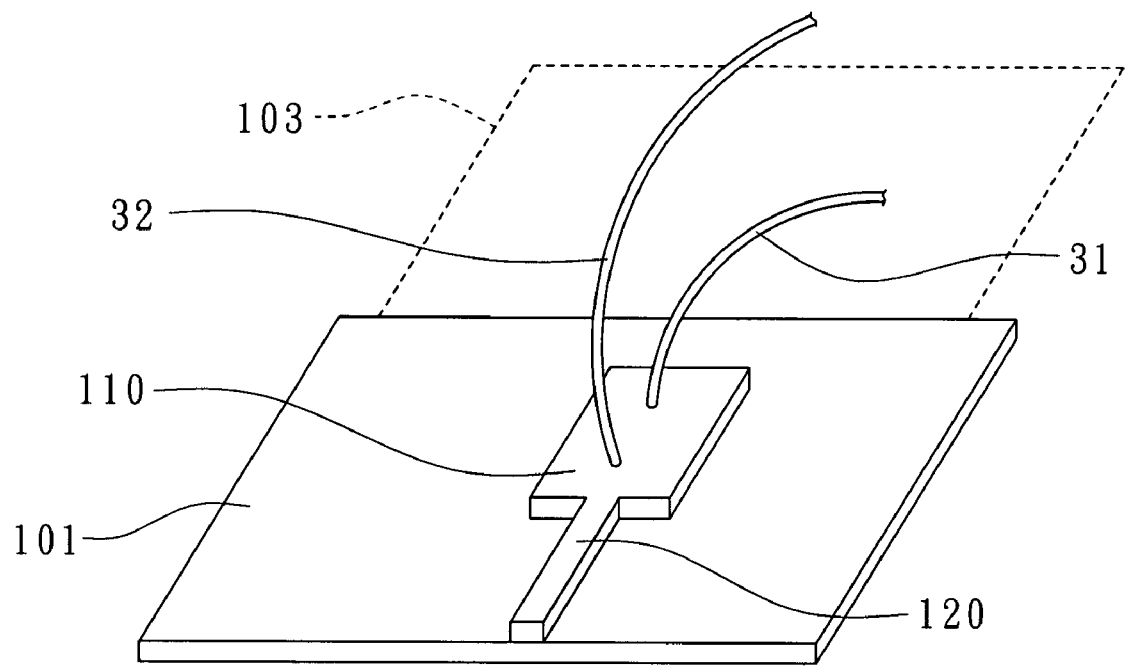
FIG. 2 shows perspective view of a portion of the known substrate after wire-bonding process.
Figure 3:
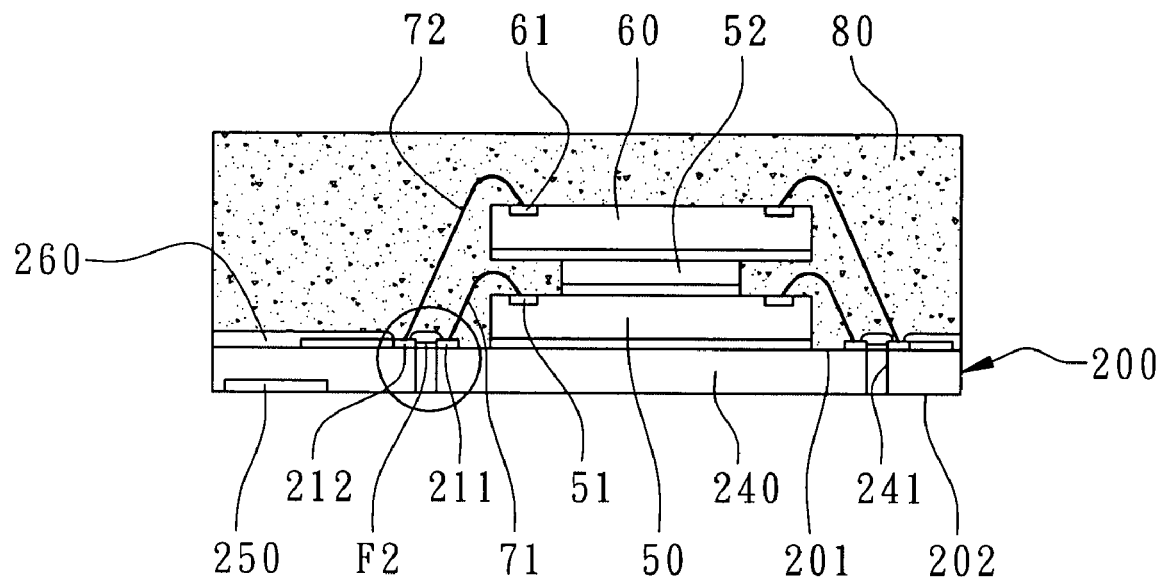
FIG. 3 is a cross-sectional view of a multi-chip stack package having a substrate in accordance with the first embodiment of this invention.

A substrate for multi-chip stacking is disclosed in accordance with one embodiment of this invention. FIG. 3 is a cross-sectional view of a multi-chip stack package having the substrate, FIG. 4 is a perspective view of a portion of the substrate after wire-bonding process, FIG. 5 is a synoptic diagram showing on/off state of a plurality of fuses referring to the results of various tests on the substrate and FIG. 6 is a cross-sectional view of a portion of the substrate.

Figure 4:
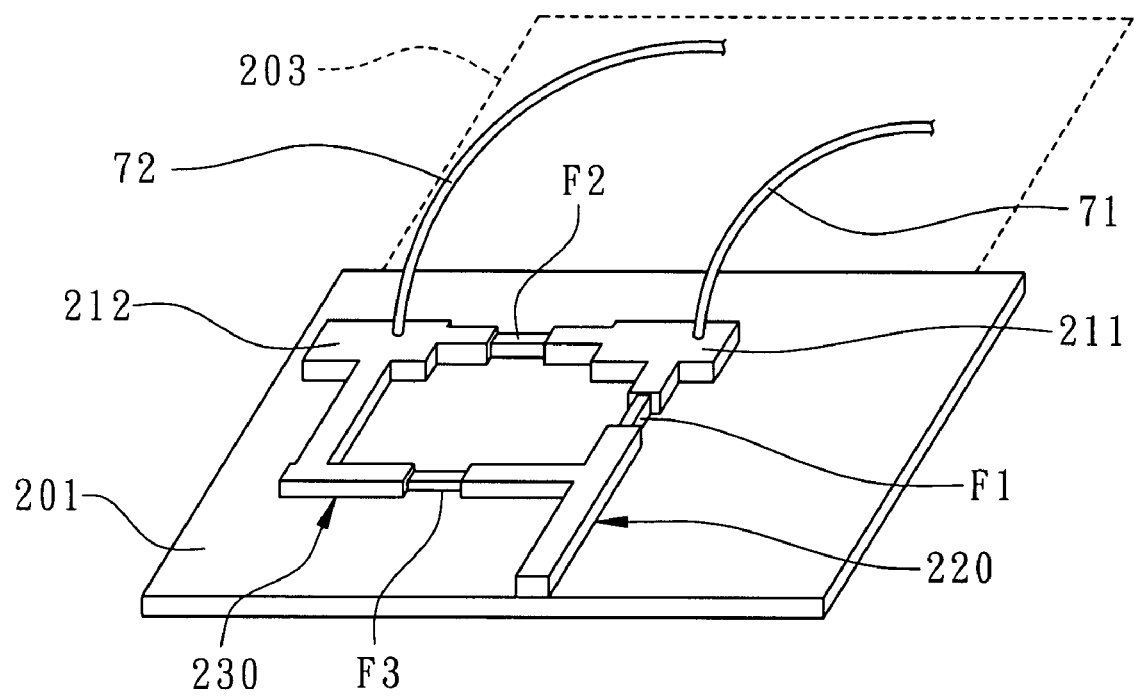
FIG. 4 shows a perspective view of a portion of the substrate after wire-bonding process in accordance with the first embodiment of this invention.
Figures 5, 6:
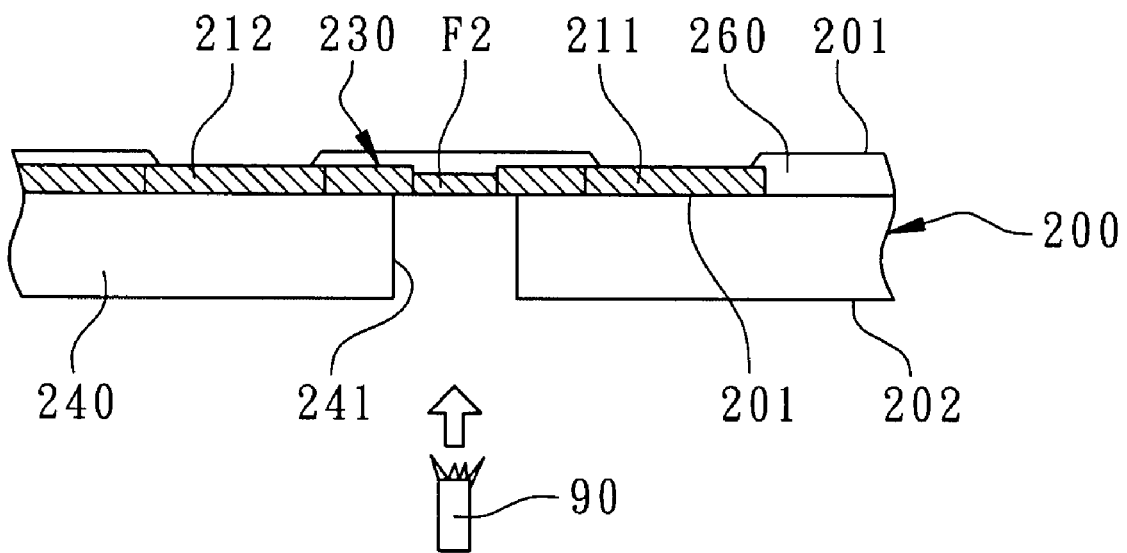
FIG. 5 is a synoptic diagram showing on/off state of a plurality of fuses referring to the results of various tests on the substrate in accordance with the first embodiment of this invention.
FIG. 6 is a cross-sectional view of a portion of the substrate in accordance with the first embodiment of this invention.

With reference to FIG. 3 and FIG. 4, the substrate 200 at least comprises a plurality of sets of fingers, each set includes a first wire-bonding finger 211, a second wire-bonding finger 212, a trace 220 and a loop wiring 230. The substrate 200 has an inner surface 201 and an outer surface 202, where a die-attaching area 203 is defined on the inner surface 201 to dispose a plurality of stacked chips 50 and 60 or more. The first wire-bonding finger 211 and the second wire-bonding finger 212 are close each other and adjacent to the die-attaching area 203 and are formed on the inner surface 201 of the substrate 200. Referring now to FIG. 4, the trace 220 is disposed on the inner surface 201 of the substrate 200 configured as an electrical transmitter. In this embodiment, the substrate 200 further has an external contact pad 250 formed on the outer surface 202 of the substrate 200 that may be a gold finger in strip shape to be applied to semiconductor product, such as a memory card.

With reference to FIG. 4 again, the loop wiring 230 connects in series with the first wire-bonding finger 211 and the second wire-bonding finger 212 and is connected to the trace 220 so as to provide repairable electrical connections among the first wire-bonding finger 211, the second wire-bonding finger 212 and the trace 220. In this embodiment, the loop wiring 230 may be disposed on the inner surface 201 of the substrate 220 and have a shape in edge(s) of polygon, circle, or ellipse. Referring to FIG. 4 again, the substrate 200 further comprises a first fuse F1, a second fuse F2 and a third fuse F3 disposed in the loop wiring 230 for providing optionally electrical disconnections, wherein the first fuse F1 is connected in series between the first wire-bonding finger 211 and the trace 220, the second fuse F2 is connected in series between the first wire-bonding finger 211 and the second wire-bonding finger 212, and the third fuse F3 is connected in series between the second wire-bonding finger 212 and the trace 220. It is preferable that the interval between the first wire-bonding finger 211 and the second wire-bonding finger 212 can dispose only one second fuse F2 to tightly dispose the first wire-bonding finger 211 and the second wire-bonding finger 212. In general, the width of each of the first fuse F1, the second fuse F2 and the third fuse F3 may be smaller than that of the loop wiring 230 so as to blow out optionally with a laser to form disconnection. In this embodiment, the first fuse F1, the second fuse F2 and the third fuse F3 may be made of a material same as the material of the loop wiring 230, such as copper, tungsten filament or other breakable metals.

According to the first embodiment of this invention, the substrate 200 may further be applied for a multi-chip stack package, particularly for a micro SD card. With reference to FIG. 3 again, a multi-chip stack package at least comprises the substrate 200, a first chip 50 and a second chip 60. The first chip 50 is disposed on the die-attaching area 203 of the substrate 200 and has a plurality of first bonding pads 51 which are electrically connected with the first wire-bonding fingers 211 by corresponding first bonding wires 71 utilizing traditional wire-bonding technique. The second chip 60 is stacked above the first chip 50 and also has a plurality of second bonding pads 61 which are electrically connected with the second wire-bonding finger 212 by corresponding second bonding wires 72 utilizing traditional wire-bonding technique. More specifically, the multi-chip stack package may further comprise an interposer 52 disposed between the first chip 50 and the second chip 60, which allows the backside of the second chip 60 not to directly contact the first chip 50 and the first bonding wires 71.

With reference to FIG. 3 again, an encapsulant 80 is formed on the inner surface 201 of the substrate 200 to seal the first chip 50, the second chip 60, the first bonding wires 71 and the second bonding wires 72. Usually the encapsulant 80 is Epoxy Molding Compound (EMC).

More particularly, the substrate 200 further has a solder resist layer 260 formed on the inner surface 201 of the substrate 200 to partially cover wiring layer of the substrate 200 including the trace 220 but expose the first wire-bonding fingers 211 and the second wire-bonding fingers 212 for wire-bonding connections.

In this embodiment, the multi-chip stack package may further comprise a control chip (not shown in figures) electrically connected with the trace 220. For example, the first chip 50 and the second chip 60 may be memory chip to assembly a memory card.

After encapsulation process, an electrical test must be performed to confirm the encapsulated chips that are in good or bad condition. And then according to test results such as shown in FIG. 5, the first fuse F1, the second fuse F2 and the third fuse F3 need to be revised correspondingly to make substitute good chip operate normally.

With reference to FIG. 4 and FIG. 5, a test result shows that a first chip 50 and a second chip 60 in one of the multi-chip stack packages are in good condition and there is no need to break any of the first fuse F1, the second fuse F2 and the third fuse F3 in this case. If the test result shows that another one of the multi-chip stack packages has the first chip 50 being fail but the second chip 60 being good, the first fuse F1 and the second fuse F2 should be broken to make the first wire-bonding finger 211 as a disconnected island. There is an electrical insulation between the first wire-bonding finger 211 and the trace 220, so that the first chip 50 located at the lower layer will be electrically insulated with inner wirings of the substrate 200 and won't interfere with the second chip 60 able to operate normally. Therefore, it is unnecessary to break or remove the first bonding wires 71 connecting with the first chip 50.

With reference to FIG. 4 and FIG. 5 again, if a test result of another multi-chip stack package shows that the first chip 50 is good but the second chip 60 has a trouble. A repairing step can be performed. The second fuse F2 and the third fuse F3 should be broken to make the second wire-bonding finger 212 as a disconnected island to create an electrical insulation between the second wire-bonding finger 212 and the trace 220. Accordingly, the second chip 60 located at the upper layer will be electrically insulated with inner wirings of the substrate 200 not to interfere with the first chip 50 able to operate normally. Therefore, there is no need to break or remove the second bonding wires 72 connecting with the second chip 60.

Accordingly, the first fuse F1, the second fuse F2 and the third fuse F3 are utilized for providing optional electrical disconnections, which allows the first chip 50 and the second chip 60 to operate respectively and independently without mutual interference. In other words, in case of that one or more of chips in a multi-chip stack package cannot operate normally, it merely needs to form an electrical disconnection by blowing out the fuse connected with the wire-bonding finger of the defective chip to make the other chips keep operating normally, thereby lowering fabricating cost. Besides, this step of forming optional disconnection by breaking fuse may be performed after die-attaching or encapsulation processes for the convenience of entire fabricating processes.

Referring to FIG. 6, the substrate 200 may further comprise an insulation layer 240, which has a plurality of openings 241 aligned with and exposing the first fuse F1, the second fuse F2 and the third fuse F3 so that the fuses F1, F2 and F3 can be blown out to form optional disconnections by laser beam. Preferably, the insulation layer 240 may be a substrate core to expose the first fuse F1, the second fuse F2 and the third fuse F3 on the outer surface 202 of the substrate 200 for forming optional disconnections by blow out them with laser beam 90. In this embodiment, the openings 241 may be filled with a dielectric filler 270 after encapsulation and repairing processes.

Figure 7A:
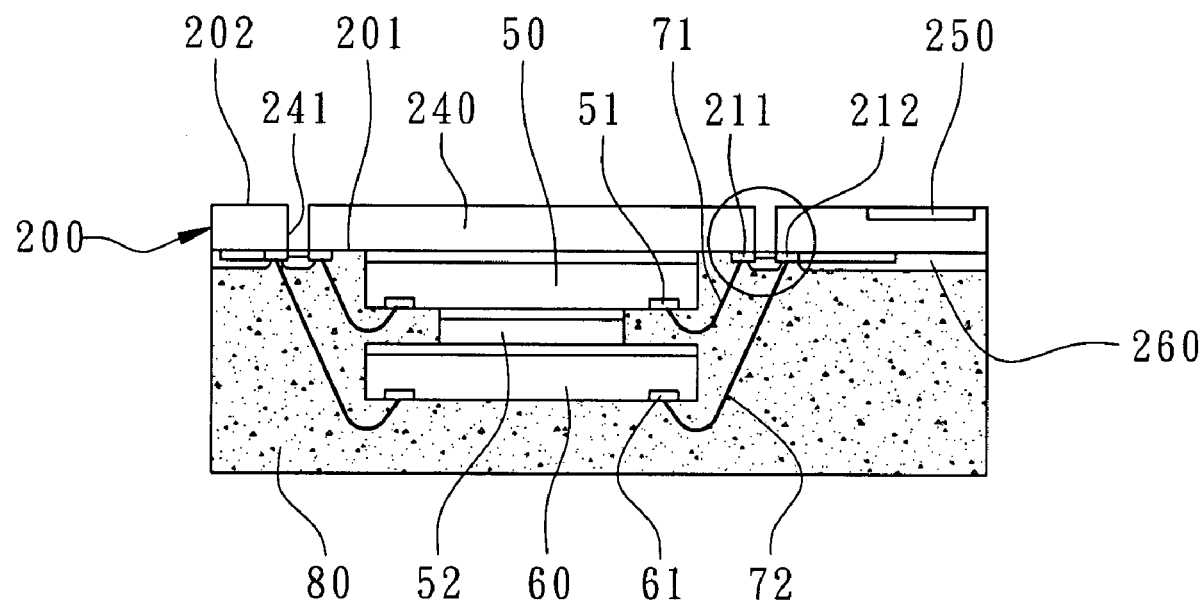
Figure 7B:
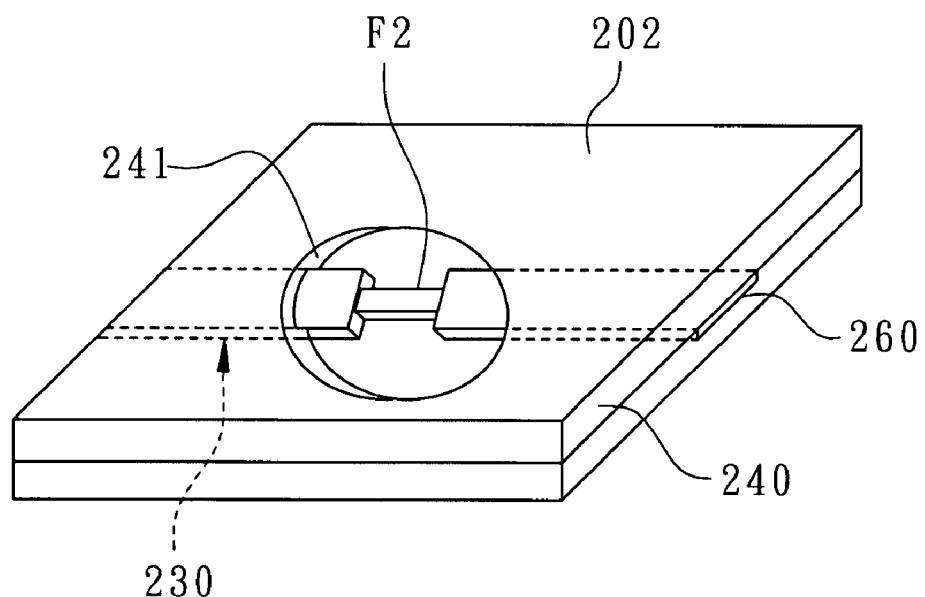
Figure 7C:
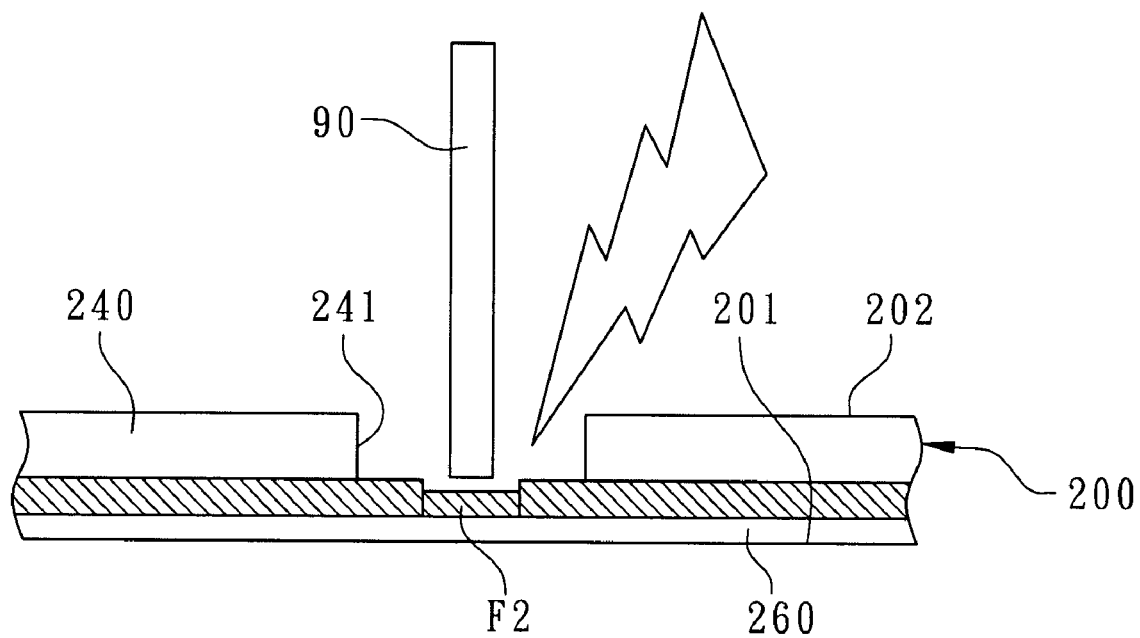
Figure 7D:
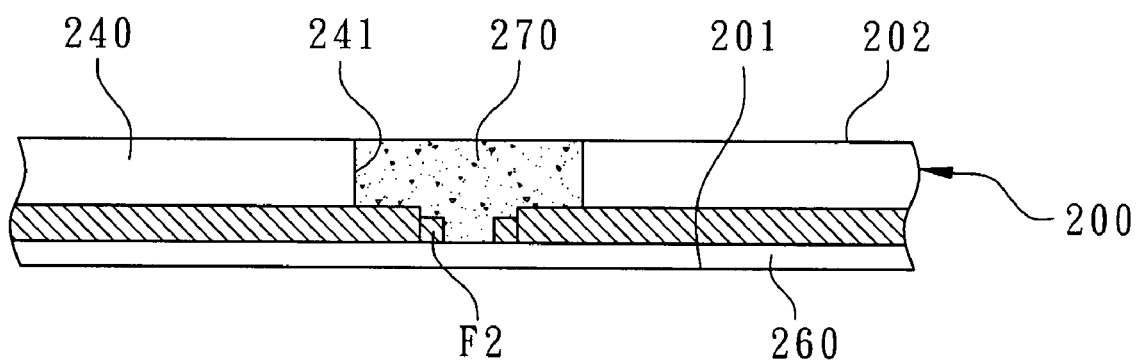

The optional disconnection is formed after wire-bonding and encapsulation processes on the substrate 200 as shown from FIG. 7A to FIG. 7D. First, a multi-chip stack package that has completed wire-bonding, encapsulation and testing processes is placed on a platform, where the outer surface 202 of the substrate 200 faces toward a laser beam generator as shown in FIG. 7A. Next is to find out which of the fuses F1, F2 and F3 are connected with the broken chip(s) and then to blow out. As shown in FIG. 7B, one of the openings 241 in the insulation layer 240 exposes the second fuse F2 connected with wire-bonding finger connecting the broken chip. As shown in FIG. 7C, hence the second fuse F2 will be blown out with a laser beam 90 to form an electrical disconnection. Finally, the opening 241 and the other openings without radiation of laser beam will be filled with the dielectric filler 270 utilizing PCB via-filling technique to prevent the fuses F1, F2 and F3 from exposing.

The second embodiment of this invention discloses another substrate for multi-chip stacking as shown in FIG. 8. The substrate 300 at least comprises a plurality of electrical mechanisms, each including a first wire-bonding finger 311, a second wire-bonding finger 312, a trace 320 and a loop wiring 330. In this embodiment, the first wire-bonding finger 311, the second wire-bonding finger 312, the trace 320 and the loop wiring 330 are disposed on an inner surface 301 of the substrate 300. The substrate 300 may further have an external contact pad 350 formed on an outer surface 302 of the substrate 300. Both the first wire-bonding finger 311 and the second wire-bonding finger 312 in each set of electrical mechanisms are adjacent each other and to a die-attaching area on which a plurality of chips 50' and 60' can be stacked. The trace 320 is configured for electrical transmission and the loop wiring 330 connects in series with the first wire-bonding finger 311 and the second wire-bonding finger 312 and is connected to the trace 320. With reference to FIG. 8 again, at least a fuse 360 may be disposed in the loop wiring 330 and is connected in series among the first wire-bonding finger 311, the second wire-bonding finger 312 and the trace 320 to provide optional disconnections.

More particularly, the substrate 300 may further comprise an insulation layer 340 that has a plurality of openings 341 aligned with and exposing the fuse 360 advantageous to break the fuse 360 with laser beam. In this embodiment, the insulation layer 340 may be a solder resist layer to expose the fuse 360 on the inner surface 301 of the substrate 300, thus the repairing step of optional disconnection will be applied during semiconductor packaging processes.

The optional disconnection is performed on the substrate 300 after wire-bonding process and prior to encapsulation process as shown from FIG. 9A to FIG. 9D. Firstly, a first chip 50' is disposed on the inner surface 301 of the substrate 300 and at least a second chip 60' is stacked above the first chip 50' as shown in FIG. 9A. Next, the wire-bonding process is performed so that the first bonding pads 51' of the first chip 50' are electrically connected with the first wire-bonding finger 311 via a plurality of first bonding wires 71' and the second bonding pads 61' of the second chip 60' are also electrically connected with the second wire-bonding finger 312 via a plurality of second bonding wires 72'. Then, a semi-finished product of the multi-chip stack package is placed on a platform before encapsulation, where the inner surface 301 of the substrate 300 faces toward a laser beam generator to expose the fuse 360. When at least a bad chip is detected by testing, the fuse 360 located around the finger(s) connected with a fail chip will be blown out by a laser beam 90' as shown in FIG. 9B. Finally, the fuse 360 is blown out to form an electrical disconnection between the fail chip and the inner wirings of the substrate 300 as shown in FIG. 9C. Accordingly, the blown fuse 360 can be utilized for forming an optional disconnection around the fail chip to make the other good stacked chips operate respectively and independently without mutual interference.

The third embodiment of this invention discloses another substrate for multi-chip stacking as shown in FIG. 10. The substrate at least comprises a first wire-bonding finger 411, a second wire-bonding finger 412, a trace 420 and a loop wiring 430. According to amount of stacked chips, the substrate further comprises at least a third wire-bonding finger 413. The first wire-bonding finger 411 and the second wire-bonding finger 412 are adjacent each other and to a die-attaching area 403 and the trace 420 is configured for electrical transmission. The loop wiring 430 connects in series with the first wire-bonding finger 411 and the second wire-bonding finger 412 and is connected to the trace 420. In this embodiment, the third wire-bonding finger 413 is configured for electrically connecting a third chip by wire-bonding technique. The third wire-bonding finger 413 is also adjacent to the die-attaching area 403 and connected in series with the loop wiring 430. The first wire-bonding finger 411, the second wire-bonding finger 412, the third wire-bonding finger 413, the trace 420 and the loop wiring 430 may be disposed on an inner surface 401 of the substrate.

With reference to FIG. 10 again, there are a first fuse F1, a second fuse F2, a third fuse F3, a fourth fuse F4 and a fifth fuse F5 disposed in the loop wiring 430, wherein the first fuse F1 is connected in series between the first wire-bonding finger 411 and the trace 420, the second fuse F2 is connected in series between the first wire-bonding finger 411 and the second wire-bonding finger 412, the third fuse F3 is connected in series between the second wire-bonding finger 412 and the trace 420, the fourth fuse F4 is connected in series between the second wire-bonding finger 412 and the third wire-bonding finger 413 and the fifth fuse F5 is connected in series between the third wire-bonding finger 413 and the trace 420, so that the fuses are provided for optional disconnections. Thus, the plurality of chips (three chips or more) can be fixed by stacking on the substrate without removing the bonding wire and the fixing process can be performed during semiconductor packaging processes or after completing entire fabricating processes, which substantially enhances flexibility and convenience in fabricating processes.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A substrate for multi-chip stacking comprising:
   a first wire-bonding finger adjacent to a die-attaching area;
   a second wire-bonding finger adjacent to the die-attaching area and to the first wire-bonding finger;
   a trace configured for electrical transmission;
   a loop wiring connecting in series with the first wire-bonding finger and the second wire-bonding finger and connected to the trace; and
   a first fuse, a second fuse and a third fuse disposed in the loop wiring, wherein the first fuse is connected in series between the first wire-bonding finger and the trace, the second fuse is connected in series between the first wire-bonding finger and the second wire-bonding finger and the third fuse is connected in series between the second wire-bonding finger and the trace.

2. The substrate in accordance with claim 1, wherein the width of each of the first fuse, the second fuse and the third fuse is smaller than that of the loop wiring.

3. The substrate in accordance with claim 1, further comprising an insulation layer having a plurality of openings aligned with and exposing the first fuse, the second fuse and the third fuse.

4. The substrate in accordance with claim 3, wherein the insulation layer is a substrate core so that the first fuse, the second fuse and the third fuse are exposed on an outer surface of the substrate.

5. The substrate in accordance with claim 3, wherein the insulation layer is a solder resist layer disposed in a manner to expose the first fuse, the second fuse and the third fuse on an inner surface of the substrate.

6. The substrate in accordance with claim 1, wherein the first wire-bonding finger, the second wire-bonding finger, the trace and the loop wiring are disposed on an inner surface of the substrate and it further comprises an external contact pad disposed on an outer surface of the substrate.

7. The substrate in accordance with claim 1, further comprising a third wire-bonding finger connected in series by the loop wiring.

8. A multi-chip stack package comprising:
   a substrate comprising:
      a first wire-bonding finger adjacent to a die-attaching area;
      a second wire-bonding finger adjacent to the die-attaching area and the first wire-bonding finger;
      a trace configured for electrical transmission;
      a loop wiring connecting in series with the first wire-bonding finger and the second wire-bonding finger and connected to the trace; and
      a first fuse, a second fuse and a third fuse disposed in the loop wiring, wherein the first fuse is connected in series between the first wire-bonding finger and the trace, the second fuse is connected in series between the first wire-bonding finger and the second wire-bonding finger and the third fuse is connected in series between the second wire-bonding finger and the trace;
   a first chip disposed on the die-attached area of the substrate and electrically connected with the first wire-bonding finger; and
   a second chip disposed above the first chip and electrically connected with the second wire-bonding finger.

9. The multi-chip stack package in accordance with claim 8, further comprising an encapsulant to seal the first chip and the second chip.

10. The multi-chip stack package in accordance with claim 9, further comprising a control chip electrically connected with the trace, wherein both the first chip and the second chip are memory chips for assembling a memory card.

11. The multi-chip stack package in accordance with claim 8, further comprising a first bonding wire connecting the first chip to the first wire-bonding finger and a second bonding wire connecting the second chip to the second wire-bonding finger.

12. The multi-chip stack package in accordance with claim 8, wherein the width of each of the first fuse, the second fuse and the third fuse is smaller than that of the loop wiring.

13. The multi-chip stack package in accordance with claim 8, wherein the substrate further comprises an insulation layer having a plurality of openings aligned with and exposing the first fuse, the second fuse and the third fuse.

14. The multi-chip stack package in accordance with claim 13, further comprising a dielectric filler to be filled in the openings.

15. The multi-chip stack package in accordance with claim 13, wherein the insulation layer is a substrate core so that the first fuse, the second fuse and the third fuse are exposed on an outer surface of the substrate.

16. The multi-chip stack package in accordance with claim 13, wherein the insulation layer is a solder resist layer disposed in a manner to expose the first fuse, the second fuse and the third fuse on an inner surface of the substrate.

17. The multi-chip stack package in accordance with claim 8, wherein the first wire-bonding finger, the second wire-bonding finger, the trace and the loop wiring are disposed on an inner surface of the substrate and the substrate further comprises an external contact pad formed on an outer surface of the substrate.

18. The multi-chip stack package in accordance with claim 8, wherein the substrate further comprises a third wire-bonding finger connected in series by the loop wiring.

* * * * *